US006968520B2

(12) United States Patent
Kawabe et al.

(10) Patent No.: US 6,968,520 B2
(45) Date of Patent: Nov. 22, 2005

(54) SYSTEM VERIFYING APPARATUS AND METHOD WHICH COMPARES SIMULATION RESULT BASED ON A RANDOM TEST PROGRAM AND A FUNCTION SIMULATION

(75) Inventors: Hiroko Kawabe, Kawasaki (JP); Masashi Sasahara, Kawasaki (JP); Itaru Yamazaki, Inagi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 10/294,659

(22) Filed: Nov. 15, 2002

(65) Prior Publication Data

US 2004/0006751 A1 Jan. 8, 2004

(30) Foreign Application Priority Data

Jul. 4, 2002 (JP) ....................................... 2002-196162
Nov. 5, 2002 (JP) ....................................... 2002-321727

(51) Int. Cl.[7] ................................................ G06F 17/50
(52) U.S. Cl. ................................................ 716/5; 716/4
(58) Field of Search .......................................... 716/5, 4

(56) References Cited

U.S. PATENT DOCUMENTS 5,465,216 A 11/1995 Rotem et al.
6,016,554 A 1/2000 Skrovan et al.
6,292,765 B1 * 9/2001 Ho et al. ....................... 703/14
6,493,852 B1 * 12/2002 Narain et al. .................. 716/5
6,539,523 B1 * 3/2003 Narain et al. .................. 716/5
6,591,403 B1 * 7/2003 Bass et al. ..................... 716/5
6,609,229 B1 * 8/2003 Ly et al. ........................ 716/4
6,651,228 B1 * 11/2003 Narain et al. .................. 716/5
6,742,166 B2 * 5/2004 Foster et al. ................... 716/4
2002/0038203 A1 * 3/2002 Tsuchiya ..................... 703/15
2003/0115562 A1 * 6/2003 Martin et al. .................. 716/5

OTHER PUBLICATIONS

X. Chen et al., Utilizing Formal Assertions for System Design of Network Processors, Proceedings of the Design, Automation and Test in Europe Conference, pp. 126–131, Feb. 2004.*

J. Yim et al., Design Verification of Complex Microprocessors, Proceedings of IEEE Asia Pacific Conference on Circuits and Systems, pp. 441–448, Jun. 1996.*

(Continued)

*Primary Examiner*—A. M. Thompson
(74) *Attorney, Agent, or Firm*—Oblon, Spivak, McClelland, Maier & Neustadt, P.C.

(57) ABSTRACT

An apparatus and method which verify a system including a microprocessor. The apparatus includes first and second simulators which verify a target architecture using a test program and a functional description of the system, respectively. The first and second simlators extract first event information that expresses a verification item relating to a specification of the system. Further, checkers compare results of verification run by the second simulator with results of verification run by the first simulator. The first and second simulators execute an identification of the verification item. The checkers further examine a coverage of the system on the basis of second event information extracted from the verification item with the first event information, if the results of the verification run by the first simulator match the results of the verification run by the second simulator. The second event information is annotation data that describes information on events based on a specification for the system.

8 Claims, 4 Drawing Sheets

OTHER PUBLICATIONS

L–C Wang et al., A New Validation Methodology Combining Test and Formal Verification for PowerPC Microprocessor Arrays, Internation Test Conference, pp. 954–963, Jul. 1997.*

J. Monaco et al., Functional Verification Methodology for the PowerPC 604 Microprocessor, 33rd Design Automation Conference, pp. 319–324, Jun. 1996.*

P. Mishra et al., Automatic Functional Test program Generation for Pipelined processors Using Model Checking, Seventh IEEE International High–Level Design Validation and Test Workshop, pp. 90–103, Oct. 2002.*

D.A. Wood et al., Verifying a Multiprocessor Cache Controller Using Random Test Generation, IEEE Design & Test of Computers, pp. 13–25, Aug. 1990.*

You–Sung Chang et al., Verification of a MicroProcessor Using Real World Applications, Proceedings of the Design Automation Conference, pp. 181–184, Jun. 1999.*

Scott Taylor et al., Functional Verification of A Multiple–issue, Out–Of–Order, Superscalar Alpha Processor–the DEC Alpha 21264 Microprocessor, Proceedings of the $35^{th}$ Annual Conference on Design Automation, pp. 638–643, May 1998.*

Scott Taylor, et al., "Functional Verification of a Multiple–Issue, Out–of–Order, Superscalar Alpha Processor—The DEC Alpha 21264 Microprocessor", $35^{th}$ Design Automation Conference, 7 pages.

* cited by examiner

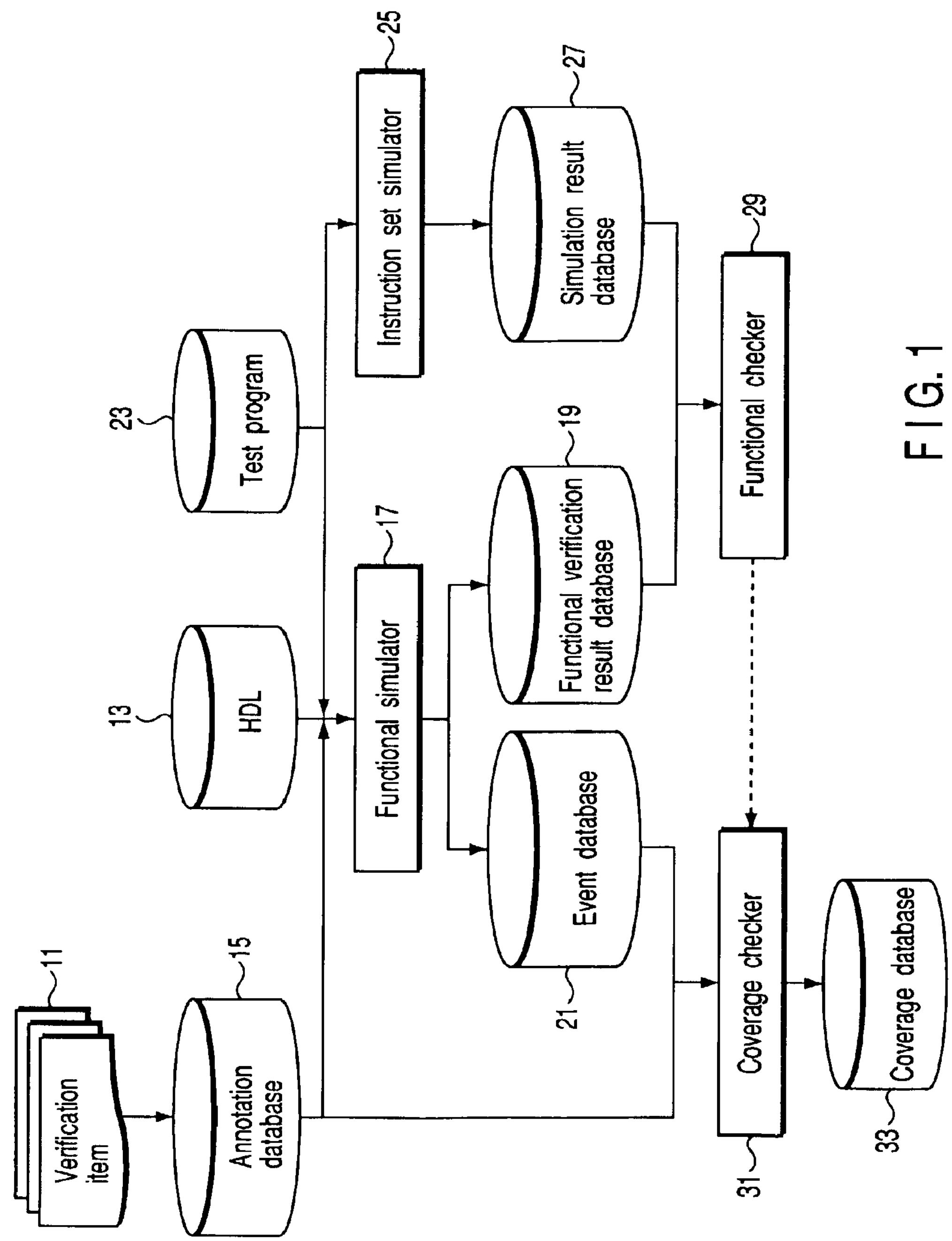
F I G. 1

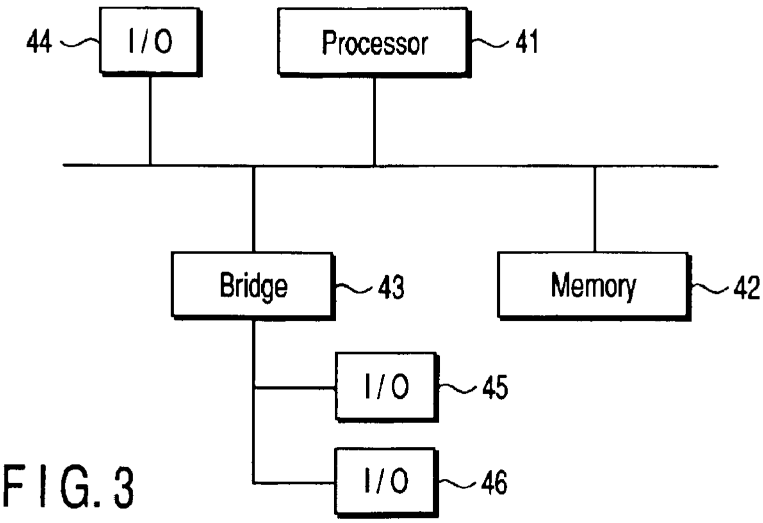
FIG. 3
FIG. 4A
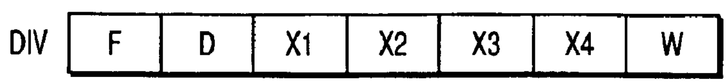
FIG. 4B
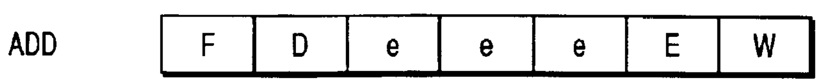
F ·· Instruction fetch, D ·· Decode,
Xn (n = 1, 2, 3, 4), E ·· Execute instructions, W ·· write back
```
{ — Event information —
      assert_time # (0, 3, 0,) req_access_test (clk, rset_n, stall_e == 1,
          ((access_reg 31 == 1) && (req_r 31 == 1) && (check_div == 1)),
          ((access_reg 31 == 1) && (req_r 31 == 0) && (check_div == 0)));
```
FIG. 5

— Test program —

```
mtc0  r0,   C0_Count          // CYCLE_COUNT_START
div   r1,   r2,   r3
add   r5,   r1,   r2
mfc0  r10,  C0_Count          // Read   Count   Register
1i    r11,  0X0004
bne   r10,  r11,  LABEL       // CYCLE_COUNT_DECISION
```

SYSTEM VERIFYING APPARATUS AND METHOD WHICH COMPARES SIMULATION RESULT BASED ON A RANDOM TEST PROGRAM AND A FUNCTION SIMULATION

CROSS-REFERENCE TO RELATED APPLICATIONS

This application is based upon and claims the benefit of priority from the prior Japanese Patent Applications No. 2002-196162, filed Jul. 4, 2002; and No. 2002-321727, filed Nov. 5, 2002, the entire contents of both of which are incorporated herein by reference.

BACKGROUND OF THE INVENTION

1. Field of the Invention

The present invention relates to a system verifying apparatus and method. More specifically, the present invention relates to an apparatus which verifies a system LSI (semiconductor integrated circuit) comprising a microprocessor, a memory, and the like.

2. Description of the Related Art

In recent years, to deal with more and more complicated systems, the degree of integration and the scale of LSIs have been increased. Thus, functional verification is consuming an inordinate amount of design cycle. One of papers says that as much as 70 percent of the design cycle is consumed by functional verification. In particular, a factor constituting a bottleneck to verification is creation of test programs.

FIG. 6 shows one of algorithms as to how a true data dependency is verified. That is, if any instruction uses a value produced by a previous instruction "div", it must delay its decoding until the previous instruction produces a result itself. FIG. 7 shows one of examples of implementation using an MIPS(R)-like assembler. We used to create such a test program manually.

Although the functionality is effectively checked by these hand-crafted tests, the number of such test scenarios become enormous as the complexity of microprocessors increase, which becomes a bottleneck of the verification efforts.

One solution for this problem is to employ a "random test". The "random test" is a method for creating sequences from a number of small sequences by arranging them randomly and checking the functionality by comparing the result between the design and the functional model.

The randomly-arranged test sequence is very effective in that the functionality and robustness of a system are exhaustively tested. It sometimes hits the scenarios that are too hard to produce or very complicated scenarios that are so hard for verification engineers to think of without making an effort in programming.

However, the random test is not a main effort in verification because it is hard to tell which test scenario has been covered by the random sequence.

Then, a test program such as the one shown in FIG. 7 must be manually created. Typically, in developing a system LSI, several hundred thousand to several million such test programs must be created.

Recently, an assertion-based simulation tool represents the next major advancement in a functional simulator for complex integration circuits. The assertion-based verification tool checks whether or not a designed logic circuit meets an operational specification for the system in connection with conditions established before or after events or always met conditions. The assertion language reduces the amount of description more than that of HDL implementation and can easily be instantiated in the design under verification to flag violations of specified functional design behavior. The assertion description language also facilitates checks on programs that may exhibit design bugs.

However, the assertion is inherently a language used to describe conditions for inhibited operations. Thus, in general, the assertion significantly improves the efficiency with which bugs are detected and a debug efficiency, but still requires operations of creating test programs. Consequently, even the assertion-based verification method cannot sufficiently reduce the amount of operations of creating test programs, which require the highest costs among the verifying operations.

Verification of the functions of the system proceeds in parallel with development of an LSI design. Setting of expected value data can be automated using an instruction set simulator created to develop software (a simulator relating to an instruction set). Further, 80 percent or more bugs can be checked using a program that randomly generates instructions. Thus, conventional random tests are desirably used effectively. However, verification using random tests makes it difficult to determine which item has been verified.

BRIEF SUMMARY OF THE INVENTION

According to an aspect of the invention, there is provided, an apparatus which verifies a system comprising at least a microprocessor comprises: a first simulator which verifies a test program for the system; a second simulator which verifies a functional description of the system to extract first event information that expresses a verification item relating to an operational specification of the system, as an event; a comparator which compares results of verification carried out by the second simulator with results of verification carried out by the first simulator; and a checker which checks whether or not the verification item is met on the basis of a second event information resulting from the verification carried out by the second simulator and the first event information if the results of the verification carried out by the first simulator match the results of the verification carried out by the second simulator.

According to another aspect of the invention, there is provided, a method of verifying a system comprising at least a microprocessor comprises: causing a first simulator to verify a test program for the system; verifying a functional description of the system to cause a second simulator to extract first event information that expresses a verification item relating to an operational specification of the system, as an event; causing a comparator to compare results of verification carried out by the second simulator with results of verification carried out by the first simulator; and causing a checker to check whether or not the verification item is met on the basis of a second event information resulting from the verification carried out by the second simulator and the first event information if the results of the verification carried out by the first simulator match the results of the verification carried out by the second simulator.

BRIEF DESCRIPTION OF THE SEVERAL VIEWS OF THE DRAWING

FIG. 1 is a block diagram showing the basic configuration of a system LSI verifying apparatus according to an embodiment of the present invention;

FIG. 3 is a block diagram showing an example of the configuration of a system LSI according to the embodiment of the present invention;

FIGS. 4A and 4B are conceptual drawings showing an instruction pipeline process executed by a test program for the system LSI of FIG. 3;

FIG. 5 shows an example of event information stored in an annotation database of the system LSI verifying apparatus of FIG. 1;

DETAILED DESCRIPTION OF THE INVENTION

Figure 2A:
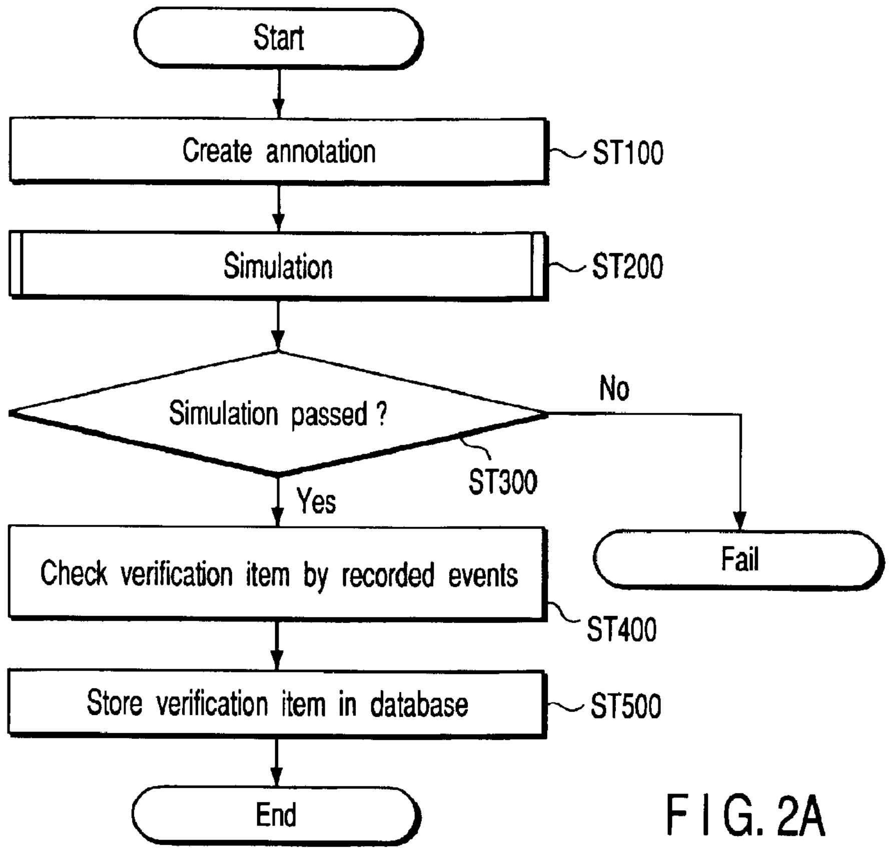
FIGS. 2A and 2B are flow charts illustrating the flow of a process executed by the system LSI verifying apparatus of FIG. 1 to implement a verifying method.

An embodiment of the present invention will be described with reference to the drawings.

FIG. 1 shows an example of the configuration of a system LSI verifying apparatus according to an embodiment of the present invention.

In FIG. 1, verification items 11 are information on events according to an operational specification for this system LSI. For example, the information includes the order of events expressed by a HDL 13 according to a system LSI functional description, and sequences and conditions for referencing past and future events.

An annotation database (fourth database) 15 stores second event information, e.g. optimized information (annotation data) indicating whether or not there is a duplicate test item for a signal for an instruction or the like obtained from an event extracted from the verification items 11. The annotation database 15, for example, stores arbitrary information by retaining it according to a time series.

A functional simulator (second simulator) 17 simulates the HDL 13 for all design levels using test program 23.

A functional verification result database (third database) 19 stores the results of verification of the HDL 13 carried out by the functional simulator 17.

An event database (first database) 21 stores event information (first event information) resulting from the verification carried out by the functional simulator 17.

A test program 23 is generated by software implementation program to generate the instruction sequence randomly.

An instruction set simulator (first simulator) 25 verifies target architecture within system LSI using the test program 23 as same as functional simulator 17.

A simulation result database (second database) 27 stores the results of verification by the test program 23 carried out by the instruction set simulator 25.

A functional checker (comparator) 29 compares the results of the verification stored in the functional verification result database 19 with the results of the verification stored in the simulation result database 27 to check whether or not they match. For example, the functional checker 29 compares program counter's values and register's values.

A coverage checker (checker) 31 checks whether or not the event information in the event database 21 matches that in the annotation database 15 to execute identification on the test item and examination of a coverage of the system LSI.

A coverage database (fifth database) 33 stores the result of the check carried out by the coverage checker 31.

Thus, the coverage checker 31 can be automatically analyzed which item 11 is verified, even if it executed the random test program, i.e, not the focused test program. Further, the use of the coverage checker 31 enables identification of other verification items 11 that have been unexpectedly verified by unintended test items. Thus, the coverage checker 31 is very beneficial. Of course, unverified test items can be easily understood by comparing the contents of the annotation database 15 with the contents of the event database 21. Furthermore, it can be determined whether or not the test program is irrelevant (unwanted), thereby allowing useless verifications to be avoided.

Figure 2B:
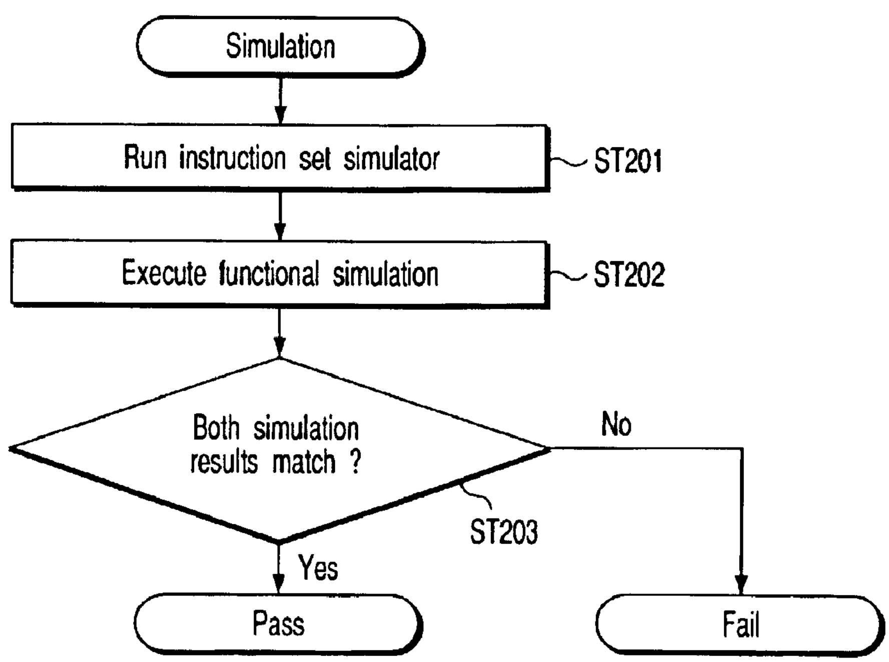

Now, the flow of a process according to a verification method will be described in detail using the flow chart shown in FIGS. 2A and 2B. In this case, it is assumed that a system LSI comprises a processor 41, a memory 42, a bridge 43, and I/O interfaces 44, 45, and 46, as shown in FIG. 3, that a test program is a MIPS(R)-like assembler for convenience, and that the processor 41 has a four-staged pipeline (fetch instruction stage F, decode stage D, execute instruction (stage Xn, stage E), and write stage W) structure. Table 1 shows the what happens in each pipeline stage of system LSI.

TABLE 1

| Pipeline Stage | |
|---|---|
| F: | fetch instructions |
| D: | decode instructions<br>access operands from resister file<br>copy operands to functional-unit reservation stations |
| E: | execute instructions and arbitrate for result buses |
| W: | write result to register file and forward results to functional-unit input latches |

Further, the processor 41 in this system LSI has a divider as a coprocessor separated from a processor main body. For example, as shown in FIG. 4A, execution stage E of a division (DIV) instruction is not finished in one cycle but requires four cycles labeled as stage X1, stage X2, stage X3, and stage X4. After these cycles, a write stage W is executed.

It is very common that the instruction that performs divide is tend to take more time than other arithmetic instruction, and thus the following instruction must wait until the result preceding divide instruction finishes to get the correct result, even if the instruction immediately follow the division.

If the result of a calculation for such a DIV instruction is used by a subsequent addition (ADD) instruction as shown in FIG. 4B, the subsequent ADD instruction must be made to wait (stalled) until a stage W for the DIV instruction is executed, as described previously. That is, such an operational specification, i.e. the test item that "during the period from stage X1 to stage X4 when the DIV instruction is executed, the dependent ADD instruction is stalled in the stage E" is identified as one of the verification items 11, shown in FIG. 1.

Thus, in this embodiment, first, an annotation is created from these verification items 11 (step ST100). In this case, in the system LSI of FIG. 3, a clock signal is defined as clk. An access signal for a register r31 is defined as access_r31. An access request signal for the register r31 is defined as req_r31. A stall signal for a DIV instruction is defined as stall_e. A signal for observing how the DIV instruction is executed is defined as check_div. Further, event information is described using an OVL (Open Verification Library). As a result, event information such as that shown in FIG. 5 is automatically generated and stored in the annotation database 15.

Figures 6, 7:
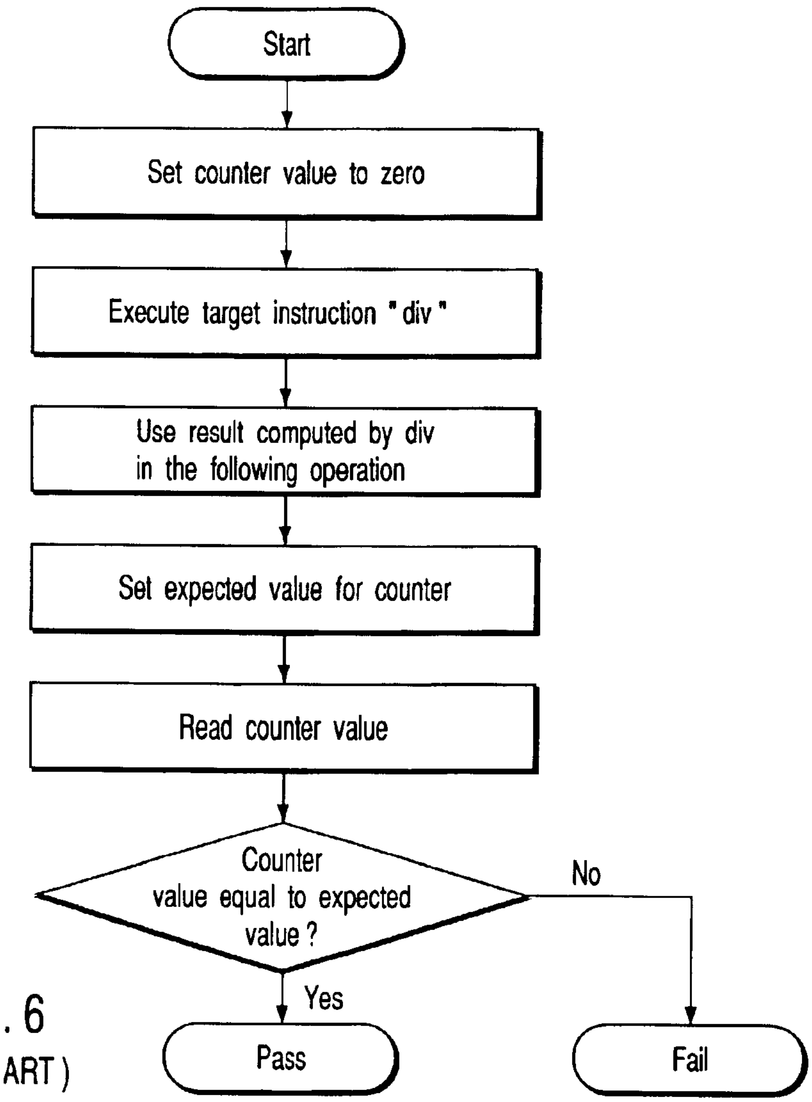
FIG. 6 is a flow chart showing an example of algorithm for verifying that the execution of a following instruction has to be delayed until a previous instruction "div" creates its execution results when the following instruction employs the execution results of the previous instruction "div"
FIG. 7 shows an example of a test program which has been created using a MIPS(R) 64 instruction set and which corresponds to the flow chart in FIG. 6.

Such event information requires a smaller amount of data to be described and is thus easier to understand, than conventional test programs (see FIG. 7), which must be manually created.

Then, simulation is carried out (step ST200). For example, the test program 23 compiled on a computer is verified by the instruction set simulator 25. Then, the results of the verification are stored in the simulation result database 27 (step ST201).

Further, the functional simulator 17 simulates the HDL 13. The results of the simulation are stored in the functional verification result database 19. Furthermore, event information resulting from the functional verification is stored in the event database 21 (step ST202).

After the simulation-based verification, the functional checker 29 compares the results of the simulation stored in the functional verification result database 19 with the results of the simulation stored in the simulation result database 27 (step ST203).

If the simulation result matches the expected result (step ST300), the coverage checker 31 compares the second event information stored in the event database 21 and the first event information stored in the annotation database 15. Then, other checked test items, e.g. the verification items 11 as to what instruction has been executed and how often it has been executed are identified (step ST400).

Subsequently, the checked verification items 11 are stored in the coverage database 33 (step ST500) to complete the series of steps.

As described above, the results of simulation carried out by a test program is compared with the event information that can be generated in the system. Thus, the visibility and verifying ability of verification items can be quantified. That is, the results of simulation can be used to automatically and reliably check whether or not a verification item set by a designer has been actually tested. This enables a reliable check as to which verification item has been verified, and enables a reduction in costs required to create a test program for verification (a reduction in amount of operations of creating test programs).

In this embodiment, it is also possible to easily detect a test program that has become unfocused activity or must be modified as a result of a change in functional description of an LSI to be designed.

Furthermore, if a functional description is reused, tested items, i.e. functions or operations used can be clarified.

In the above described embodiment, the functional verification result database and the simulation result database are provided. The embodiment of the present invention is not limited to this aspect. If for example, the functional checker is caused to perform operations concurrently, the functional verification result database and the simulation result database can be omitted.

Further, for the above described event information (see FIG. 5), sections enclosed by /**/ such as:

```
assert_time # (0, 3, 0) req_access_test (/*
system_clock_name */, /* reset signal name */,
/*stall_signal_name * /==1,
    ( (/* access_register_name * /==1) && (/*
request_signal_name */==1) && (/* check_signal_name
* /1 ==) , and
    ( (/* access_register_name */==1) && (/*
request_signal_name */==0) && (/* check_signal_name
* /==0)
```

can be automatically created, if there are a template that automatically provides the corresponding signals on the basis of a test program and an operational specification, and a signal list such as "'define clk system_clock_name".

Moreover, the embodiment of the present invention is not limited to a system LSI comprising a microprocessor, a memory, and the like. The embodiment of the present invention is also applicable to various systems comprising a system LSI configured as described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus which verifies a system comprising at least a microprocessor, the apparatus comprising:

a first simulator which verifies target architecture using a test program;

a second simulator which verifies a functional description of the system to extract first event information that expresses a verification item relating to an specification of the system;

a first checker which compares results of verification run by the second simulator with results of verification run by the first simulator; and a second checker which executes identification of the verification item, and examination of a coverage of the system on the basis of a second event information extracted from the verification item with the first event information if the results of the verification run by the first simulator match the results of the verification run by the second simulator, the second event information being annotation data that describes information on events based on a specification for the system.

2. The apparatus according to claim 1, wherein the test program is a random test program generated by a software implementation program to generate an instruction sequence randomly.

3. The apparatus according to claim 1, further comprising:

a first database to store the first event information;

a second database to store the results of the verification run by the first simulator;

a third database to store the results of the verification run by the second simulator;

a fourth database to store the second event information; and a fifth database to store results of a check run by the second checker.

4. The apparatus according to claim 1, wherein the second event information is one of an order of the events and conditions for sequences referencing past or future events.

5. A method of verifying a system comprising at least a microprocessor, the method comprising:

causing a first simulator to verify target architecture using a test program;

verifying a functional description of the system to cause a second simulator to extract first event information that expresses a verification item relating to a specification of the system;

causing a first checker to compare results of verification run by the second simulator with results of verification run by the first simulator; and causing a second checker to execute identifying the verification item, and examining a coverage of the system on the basis of second event information extracted from the verification item with the first event information if the results of the verification run by the first simulator match the results of the verification run by the second simulator, the second event information being annotation data that describes information on events based on a specification for the system.

6. The method according to claim 5, wherein the test program is a random test program generated by software implementation program to generate an instruction sequence randomly.

7. The method according to claim 5, further comprising:

storing the first event information in a first database;

storing the results of the verification run by the first simulator, in a second database;

storing the results of the verification run by the second simulator, in a third database;

storing the second event information in a fourth database; and storing results of a check run by the second checker, in a fifth database.

8. The method according to claim 5, wherein the second event information is one of an order of the events and conditions for sequences referencing past or future events.

* * * * *